(12) United States Patent
Machado

(10) Patent No.: US 10,145,875 B1
(45) Date of Patent: Dec. 4, 2018

(54) SYSTEM FOR MONITORING AND EVALUATING ELECTROMAGNETIC CONTAMINATION BY SOURCE

(71) Applicant: Noxtak Corp., Miami, FL (US)

(72) Inventor: Jose Machado, Miami, FL (US)

(*) Notice: Subject to any disclaimer, the term of this patent is extended or adjusted under 35 U.S.C. 154(b) by 0 days.

(21) Appl. No.: 15/793,431

(22) Filed: Oct. 25, 2017

Related U.S. Application Data

(63) Continuation-in-part of application No. 15/151,271, filed on May 10, 2016.

(51) Int. Cl.
*G01J 1/00* (2006.01)
*G01R 29/08* (2006.01)

(52) U.S. Cl.
CPC .............. *G01R 29/0857* (2013.01)

(58) Field of Classification Search
CPC .......... G01D 5/268; G01K 11/12; G01L 1/24; G01M 11/02
See application file for complete search history.

(56) References Cited

U.S. PATENT DOCUMENTS

2007/0205891 A1* 9/2007 Spencer .................. G01T 1/17
340/539.29

OTHER PUBLICATIONS

Li et al., "A new calibration method for tri-axial field sensors in strap-down navigation systems," 2012, Measurements Science and Technology, vol. 23, No. 105105, 6 pages.*

\* cited by examiner

*Primary Examiner* — Kiho Kim
(74) *Attorney, Agent, or Firm* — Sanchelima & Associates, P.A.; Christian Sanchelima; Jesus Sanchelima

(57) ABSTRACT

The various embodiments herein disclose an improved method and system for detection, monitoring and management of electrosmog levels at required locations which comprises of electrosmog levels being read by one or more sensors on the multiple sensor device installed at multiple locations, recording, interpreting and processing the data relating to electrosmog levels by using various scientific algorithm and mathematical calculation at the central monitoring equipment device and providing the user a simplified and more accurate data representing the levels of the electrosmog and identifying the source of the electromagnetic contamination.

12 Claims, 3 Drawing Sheets

SYSTEM FOR MONITORING AND EVALUATING ELECTROMAGNETIC CONTAMINATION BY SOURCE

OTHER RELATED APPLICATIONS

The present application is a continuation-in-part of pending of U.S. patent application Ser. No. 15/151,271, filed on May 10, 2016, which is hereby incorporated by reference.

BACKGROUND OF THE INVENTION

Field of the Invention

The present invention broadly relates to the field of detection, monitoring and management of electromagnetic radiation. More particularly, the present invention relates to an improved method and system for detecting, monitoring and management of electrosmog by reading the electrosmog levels through sensors and alerting the required personnels or other concurrently connected system to take necessary action in case of increased levels of electrosmog being detected.

Description of the Related Art

This section provides background information related to the present disclosure which is not necessarily prior art and provides a general summary of the disclosure, and is not a comprehensive disclosure of its full scope or all of its features.

Electrosmog is the invisible electromagnetic radiation resulting from the use of both wireless technology and electricity. The most common sources of wireless electrosmog are: Cordless phones, Cordless baby alarms, Mobile/cellular phone masts/towers/transmitters, Mobile/cellular phones, Wireless networks etc.

Electrosmog is responsible for a condition known as electrosensitivity (ES) or electrohypersensitivity (EHS). Symptoms include: headaches, disruptive sleep patterns, chronic fatigue, depression, hypersensitivity, erratic blood pressure, skin complaints and modified behavioral patterns in children.

Children, the elderly and anyone with a lowered immune system are most at risk from the health effects due to electrosmog. The health effects from electrosmog can take 10-20 years to manifest themselves, however for some, the effect can appear immediately. Research shows that between 3% and 5% of the general population could be ES sufferers. In Sweden, for example, 285,000 people (over 3% of the population) are registered as ES and claim disability benefit from the government. In November 2005, the Health Protection Agency printed the 'Definition, Epidemiology and Management of Electrical Sensitivity' report, commissioned to identify and appraise the literature in order to describe and define ES.

Current methods for detecting electrosmog include using hand held devices for home and small buildings and in case of big industries or big vicinity, electrosmog detectors are installed at various locations in the buildings. These electrosmog detectors record the levels of electrosmog and the recorded levels are logged for the purpose of review. Further, to interpret the recorded levels of electrosmog, an expert is required as the data which is logged or recorded is a raw data read by a sensor and is difficult for any ordinary user to interpret.

Hence there is a need for an improved method and system for detection, monitoring and management of electrosmog levels at required locations. Further there is a need for an improved method and system for interpreting the recorded or logged electrosmog data using various mathematical and scientific calculations such that any ordinary user can interpret or understand the provided data.

The above mentioned shortcomings, disadvantages and problems are addressed herein and which will be understood by reading and studying the following specification.

SUMMARY OF THE INVENTION

It is therefore a primary object of the present invention to provide an improved method and system for detection, monitoring and management of electrosmog levels at required locations.

It is also an object of the present invention to provide a system for detection, monitoring and management of electrosmog levels at required locations where the electrosmog data is recorded and calculated with its built-in algorithm and provides simplified user understandable data indicating the levels of electrosmog in places where the sensors are installed.

These and other objects are achieved by providing an improved method and system for detection, monitoring and management of electrosmog levels at required locations which comprises of electrosmog levels being read by one or more sensors installed at multiple locations, recording, interpreting and processing the data relating to electrosmog levels by using various scientific algorithm and mathematical calculation and providing the user a simplified and more accurate data representing the levels of the electrosmog.

According to an embodiment of the present invention, the system comprises of a central monitoring device and a multiple sensor device. The central monitoring device comprises of a data processing means such as but not limited to a microprocessor, one or more data receiving means such as but not limited to a data transmitters, Wi-Fi data receivers, Bluetooth radio data receivers, a dual band backup transceiver, one or more USB ports, one or more RJ45 network ports; a power means such as but not limited to a battery, a random access memory to support the data processing by a data processing means, a display means such as but not limited to LCD display, a storage means such as but not limited to a hard disk for storing the received data, and an alphanumeric keyboard.

Further, the multiple sensor device comprises of one or more sensors that are configured to sense electrosmog wherein the sensors are but not limited to electric and magnetic sensors, a data transmitting means such as but not limited to WIFI equipment. Bluetooth 4.0: backup transmitter (Dual Band), a display means such as but not limited to a LCD screen, an antenna for long range data transmissions, a data processing means such as but not limited to microprocessor, a random access memory to support data processing means in processing the sensed data, a light illumination means such as but not limited to green and red LED lights and a powering means such as a battery.

According to the embodiment, one or more multiple sensor devices are placed in areas where the electrosmog levels are to be monitored. The placed sensor devices are networked and are connected to central monitoring equipment for exchange of data. The sensors present on the multiple sensor device sense the relevant levels of electromagnetic radiation, and the data relevant to the sensed electromagnetic radiation is primarily processed and transmitted to the central monitoring equipment through any of the available data transmission means. The central monitoring equipment, receives the transmitted data from the sensor devices through the data communication means, processes the received data with the scientific formulas and mathematical calculations to determine the level of the electrosmog. The scientific formulas and mathematical calculations are pre-programmed and stored in the storage means of the central monitoring equipment. On processing the sensed data by the central monitoring equipment and if the electrosmog levels are high, the central monitoring equipment sends distress signal to the particular sensor device with additional data indicating the levels of electrosmog through the communication means.

The multiple sensor devices, on receiving the distress signal with the additional data, displays the additional data on the display means and the RED led is turned ON indicating high level of electrosmog and alerting the necessary personnel through any of the commination means to take necessary actions in controlling the electrosmog levels. The additional data can be but not limited to electrosmog levels, temperature levels etc. Further, a GREEN light will be turned ON in case the detected electrosmog levels are not more than the safe levels.

It is to be noted that, the multiple sensor devices can also be configured to comprise GPS components thereby; the location of the presence of electrosmog is recorded and located on graphical maps in the central monitoring equipment. Further, it is to be noted that on determining high levels of electrosmog, the central monitoring equipment through the multiple sensor device can send distress signal directly to devices to turn OFF or to enable SLEEP mode, to any devices which can receive wireless or wired data including infrared signals to turn OFF the televisions and air-conditioners.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

The drawings described herein are for illustrative purposes only of selected embodiments and not all possible implementations, and are not intended to limit the scope of the present disclosure.

Figure 1:
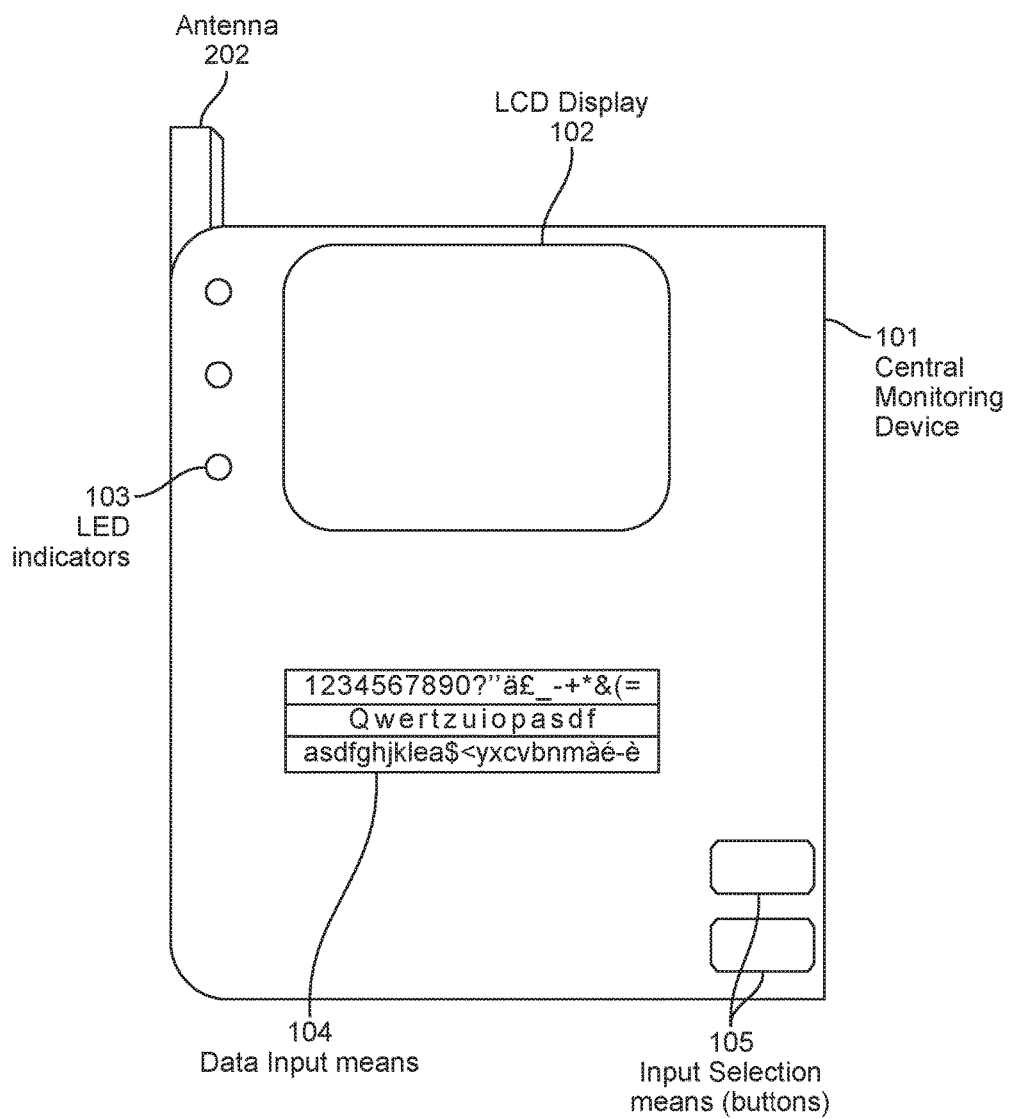
FIG. 1 depicts central monitoring equipment capable of receiving, processing and transmitting signals to determine the levels of electrosmog levels, according to an embodiment of the present disclosure.
Figure 2:
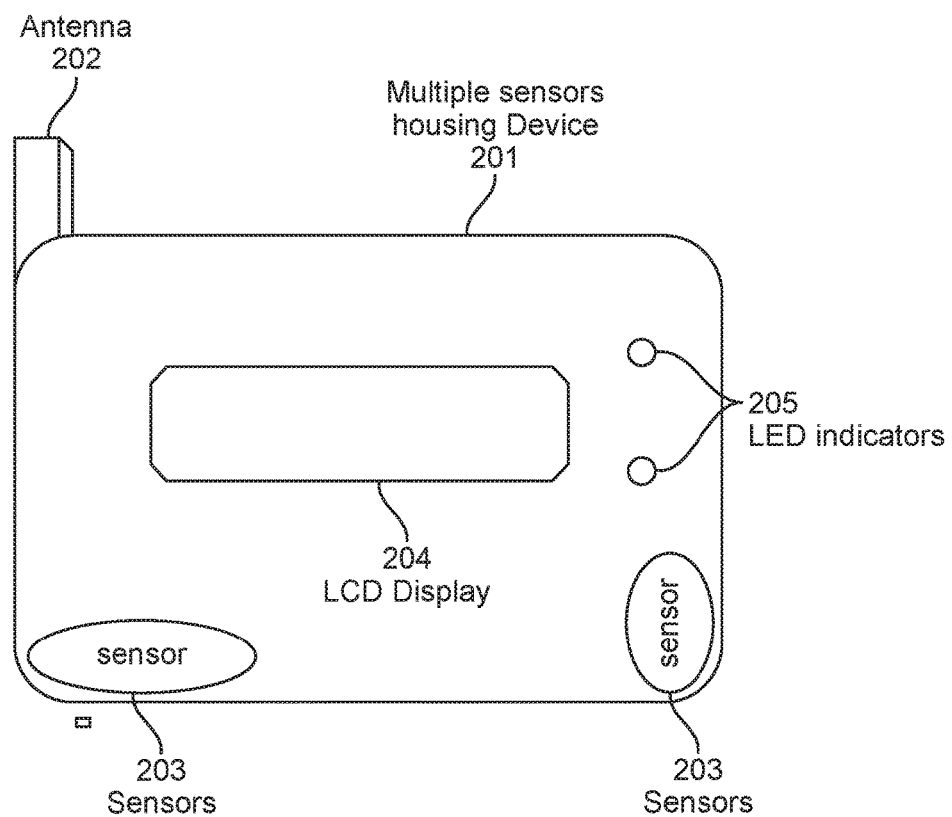
FIG. 2 depicts multiple sensor reading device capable of sensing data related to electrosmog and transmitting sensed data signals to the central monitoring equipment to determine and alert the user about the levels of electrosmog, according to an embodiment of the present disclosure.
Figure 3:
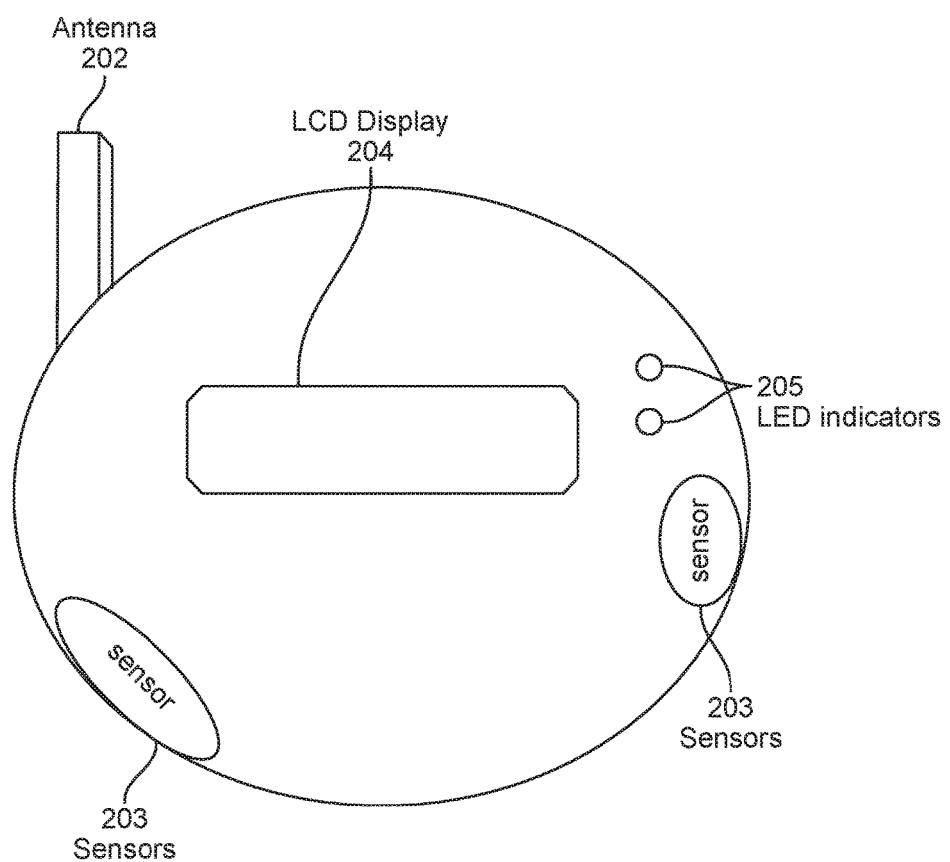
FIG. 3 depicts an additional embodiment of the multiple sensor reading device capable of sensing data related to electrosmog and transmitting sensed data signals to the central monitoring equipment to determine and alert the user about the levels of electrosmog, according to an embodiment of the present disclosure.

Although specific features of the present invention are shown in some drawings and not in others. This is done for convenience only as each feature may be combined with any or all of the other features in accordance with the present invention.

DETAILED DESCRIPTION OF THE EMBODIMENTS

The present invention discloses an improved method and system for detection, monitoring and management of electrosmog levels at required locations. In the following detailed description of the embodiments of the invention, reference is made to the accompanying drawings that form a part hereof, and in which are shown by way of illustration specific embodiments in which the invention may be practiced. These embodiments are described in sufficient detail to enable those skilled in the art to practice the invention, and it is to be understood that other embodiments may be utilized and that changes may be made without departing from the scope of the present invention. The following detailed description is, therefore, not to be taken in a limiting sense, and the scope of the present invention is defined only by the appended claims.

According to the embodiment, the present invention provides an electromagnetic radiation sensing equipment and automatic monitoring of electromagnetic radiation linked to a network of sensors installed in a building, in order to assess and monitor permanent exposure levels of electrosmog present and to determine whether any part of the property has more radiation levels and thus indicate to the user or the concerned person that a particular area requires attention.

The system presented in this invention is configurable and can assimilate other data and add them to the process of continuous evaluation. The system is configured using the parameters of scale and average exposure levels of the property, collecting readings in mG, dB, mW/cm2, uT, dBm and crosswise calculate the data and display a result that allows users to receive alerts and notifications automatically when necessary action has to be taken on a user's part to keep the property free of electrosmog.

The system comprises of a central monitoring device 101 and one or more multiple sensor devices 201 installed along the property where the user is interested in monitoring the electrosmog. The central monitoring 101 device comprises of a data processing means such as but not limited to a microprocessor, one or more data receiving means such as but not limited to a data transmitters, Wi-Fi data receivers, Bluetooth radio data receivers, a dual band backup transceiver, one or more USB ports, one or more RJ45 network port; a power means such as but not limited to a battery, a random access memory to support the data processing by a data processing means, a display means 102 such as but not limited to LCD display, a storage means such as but not limited to a hard disk for storing the received data, and an alphanumeric keyboard. The dimension of the central monitoring is approximately 20×10 cm and 2.5 cm in thickness.

The core components of the central monitoring equipment 101 is about 10×20 cm and is made up of a transmitter of high frequency data transmission, Wi-Fi, serial protocol and a pre-built software that processes the data and a digital display indicating the current status of exposure to electromagnetic radiation. Further, the central monitoring equipment 101 comprises of an internal backup hard drive and USB ports to which access is via a secret PIN introduced directly into an alphanumeric keypad available in front of the central monitoring equipment.

The core components of the system is itself free from the electromagnetic pollution and the system communicates and exchange data related to automated data for monitoring and processing of data and provide multiple readings of non-ionizing radiation received by multiple computerized sensors installed throughout a building to get a comprehensive report of multiple measurements on the values set by the user: dB (decibels), mW/cm2 (milliWatts), mG (milli Gauss) or uT (micro Tesla), V/in (volts per meter) A/m (Ampere per meter) among others.

The system with the received data uses algorithms and mathematical formulas such as Maxwell's equations jointly processed to estimate the levels of non-ionizing radiation with harmful effects on the environment and living things, including a mathematical estimation of levels SAR (Specific Absorption rate). The system also additionally uses NOX-TAK Radiation Scale, and the type of solution SPIRO unit installed in the building, both as an identifier parameter of the type of emission and its degree of potential damage. Optionally, any conventional radiation scale can be used.

Reception and Processing System data will be through the wireless network or Wi-MAX WiFi installed in the building and the data is stored simultaneously into cloud storage as well as to a hard disk as a backup.

The multiple sensor device 201 comprises of one or more sensors 203 that are configured to sense electrosmog wherein the sensors 203 are but not limited to electric and magnetic sensors, a data transmitting means such as but not limited to WIFI equipment. Bluetooth 4.0: backup transmitter (Dual Band), a display means such as but not limited to a LCD screen 204, an antenna 202 for long range data transitions, a data processing means such as but not limited to microprocessor, a random access memory to support data processing means in processing the sensed data, a light illumination means such as but not limited to green and red LED lights 205 and a powering means such as a battery. The size of the multiple sensor device 201 can be 12 cm×12 cm and a thickness of 2.5 cm. Further, the multiple sensor device 201 can house components including but not limited to electric sensor and magnetic sensors with Frequency Range: RF (100 MHz to 100 Ghz), LF (50 Hz to 10 kHz) and sensitivity of the sensors 203 ranging RF (−60 dBm to 50 dBm), (0.01 uW/cm2 to 180 W/cm2) LF (0.1 mG to 20,000 mG) with measurement units in dBm, mW/m2, v/in, a/m, uT, mG.

The system can monitor the electrosmog of a given area where a SPIRO solution has been installed to neutralize harmful electromagnetic contamination. There are multiple devices and sensors for detecting electromagnetic radiation and in turn are variable for neutralizing electrosmog, according to classification levels NOXTAK. The process of sending data may be carried out in periodic manner according to the settings a user selects when installing the system. The SPIRO solution consists of an apparatus subject of U.S. patent application Ser. No. 15/080,227 that includes ferromagnetic materials when in nanoscale that organize the polarity of radiation to eliminate electromagnetic contamination.

This allows the manufacturer and operator a continuous evaluation method that allows a user to monitor the installed SPIRO solution. Each time the system indicates that the electrosmog has risen above a set value beyond the SPIRO solution's electrosmog neutralization capacity, an alert will be sent to the user. For this, display apparatus reading in real time is required and additionally two lights a green and a red indicate to the user when some of the sensors of the system perceive increased radiation and therefore can notify a user to add additional or more powerful SPIRO solutions.

The monitoring system subject of the present invention identifies the source of contamination by way of capturing which type of radiation within the electromagnetic spectrum is out of value. This determination is achieved by sequential installation of tri-axial magnetic and electrical sensors calibrated in bands or groups of specific frequencies (ELF, VLF, LF, HF SHF, EHF) and whose readings are not based on identification frequencies but to identify sources of electrical, magnetic or electromagnetic pollution in multiple values dB, mGauss, v/m, a/m, w/cm2. Such readings are collected by the software in a vector analysis of the readings received. After comparing these values with all the equipment registered in its monitoring zone and provided with the classification and behavior of the average emissions of electronic and electrical appliances, the software can make a determination quite precisely as to what kind of source is polluting the environment with electromagnetic pollution above a potentially hazardous value. The monitoring system can be installed in any building or zone with the number of sensors determined based on each scenario and purpose in order to obtain a more detailed monitoring in a specific area. For instance, a laptop produces a direct current magnetic field which will be read by sensors used to detect direct current. Alternatively, devices that run on alternate current, sensors that detect alternate current will be used. In addition, the pulse of the emission of the equipment varies depending on the type of device. For instance, routers can be differentiated in the system based on the Hertz capabilities of each. These parameters can be programmed in the software and in addition to the pulse and/or type of current each equipment emits. The system is also programmed to include a threshold level for each pulse and/or current and if any is surpassed then the system alerts users that there is electromagnetic contamination that could be harmful.

At the same time, the monitoring system can collect information from other sensors and electrical equipment connected to the same wireless network of the system. By doing so, the arrival of the Internet of Things (IOT) provides a perfect ally to monitor radiation using sensors of all IOT equipment installed in a particular building. The higher the connectivity of the system, the greater precision the system will have when monitoring a particular area or building. All sensors installed communicate via a common interface periodically, which can be WIFI, LI-FI or Bluetooth. The software automatically deducts the signal strength of the interface provided by the vector analysis data and thus the signal that feeds the monitoring system does not affect the environmental diagnosis it seeks.

The device in turn has an internal memory capable of storing measurement history and this history information can be shared through any of the data transition means such as but not limited to Wi-Fi protocols. The user or the concerned person can also share their history readings to a central computer, identifying in this case with specific code that sets it apart from all the remaining inventory of sensors. Alternatively, the device may function independently just storing the readings in its internal memory and downloading them to the user computer periodically on a custom defined time interval.

Although the embodiments herein are described with various specific embodiments, it will be obvious for a person skilled in the art to practice the invention with modifications. However, all such modifications are deemed to be within the scope of the claims. It is also to be understood that the following claims are intended to cover all of the generic and specific features of the embodiments described herein and all the statements of the scope of the embodiments which as a matter of language might be said to fall there between.

What is claimed is:

1. A system comprising a network of multiple-sensor reading devices that each house an electric and magnetic sensor that detect electromagnetic contamination and inform a user as to a device that is the source of said contamination, a central monitoring device that determines from said network the source of said electromagnetic contamination and the quantity levels emitted from each source using a signature of the device, a display assembly displaying the amount of electromagnetic contamination from each source in real-time, a software that is programmed with permissible types, directions, frequencies, or quantity amounts of pulses or currents for various devices, said system adapted to alert users if the level of pulses or currents surpass said permissible levels.

2. The system of claim 1 wherein said central monitoring device collects said electromagnetic source and quantity levels using a Wi-Fi data receiver housed within said central monitoring device, said network including a Wi-Fi data transmitter.

3. The central monitoring device of claim 1 wherein data received from said network is processed using algorithms and Maxwell equations to determine the amount and source of said electromagnetic contamination.

4. The multiple-sensor reading devices of claim 1 including at least one alarm upon programmed electromagnetic contamination threshold being exceeded.

5. The system of claim 1 wherein the data received by said central monitoring device is stored to a server connected via a cloud.

6. The system of claim 1 wherein all of its components are free from electromagnetic contamination.

7. The sensors of said multiple-sensor reading devices of claim 1 having a dimension of 12 cm×12 cm and a thickness of 2.5 cm.

8. The multiple sensor reading device of claim 1 wherein said sensors have a frequency range between 50 Hz to 100 GHz and sensitivity of the sensors ranging between −60 dBm to 50 dBm.

9. The system of claim 1 wherein said electromagnetic contamination source and quantity data is downloaded periodically onto a user's computer.

10. The system of claim 1 wherein said display assembly displays data from any of the multiple sensor reading devices individually.

11. The system of claim 1 wherein said electrical and magnetic sensors are tri-axial.

12. A system comprising a network of multiple-sensor reading devices that each house an electric and magnetic sensor that detect electromagnetic contamination and inform a user as to source of said contamination, a central monitoring device that collects from said network the source of said electromagnetic contamination and the quantity levels emitted from each source using the signature of the device, a display assembly displaying the amount of electromagnetic contamination from each source in real-time, a software that is programmed with permissible types, directions, frequencies, or quantity amounts of pulses or currents for various devices, said system adapted to alert users if the level of pulses or currents surpass said permissible levels, said network includes at least one apparatus used to organize the polarity of said electromagnetic contamination and thereby neutralizing said electromagnetic contamination, said multiple-sensor devices connected to at least one apparatus to emit an alarm when the electromagnetic contamination threshold exceeds at least one apparatus' electromagnetic contamination capacity.

* * * * *